United States Patent [19]
Jarman

[11] 3,977,071
[45] Aug. 31, 1976

[54] HIGH DEPTH-TO-WIDTH RATIO ETCHING PROCESS FOR MONOCRYSTALLINE GERMANIUM SEMICONDUCTOR MATERIALS

[75] Inventor: Hall E. Jarman, Dallas, Tex.

[73] Assignee: Texas Instruments Incorporated, Dallas, Tex.

[22] Filed: Sept. 29, 1969

[21] Appl. No.: 862,646

[52] U.S. Cl. .................................... 29/580; 29/572; 29/578; 29/589; 29/591; 357/60; 156/17; 156/18
[51] Int. Cl.² ...................... B01J 17/00; H01L 31/18
[58] Field of Search ............ 29/572, 578, 580, 589, 29/591; 156/17, 18; 357/60

[56] References Cited
UNITED STATES PATENTS

| | | | |
|---|---|---|---|
| 3,151,379 | 10/1964 | Escoffery | 29/572 |
| 3,162,507 | 12/1964 | Dermatis et al. | 23/1 |
| 3,227,580 | 1/1966 | Thornton | 156/17 |
| 3,266,961 | 8/1966 | Emels | 156/17 |
| 3,290,753 | 12/1966 | Chang | 156/17 |
| 3,423,261 | 1/1969 | Frantzen | 156/18 |
| 3,436,285 | 4/1969 | Wilkes | 156/17 |
| 3,490,943 | 1/1970 | Werdt | 156/17 |
| 3,508,980 | 4/1970 | Jackson, Jr. et al. | 29/572 |

OTHER PUBLICATIONS

Arthur P. Honess; *The Nature, Origin, and Interpretation of the Etch Figures on Crystals*, John Wiley & Son Inc., New York, 1927 pp. 6, 14, 15 & 27.

*Primary Examiner*—Benjamin R. Padgett
*Assistant Examiner*—B. Hunt
*Attorney, Agent, or Firm*—Harold Levine; James T. Comfort; Gary C. Honeycutt

[57] ABSTRACT

A process for etching high depth-to-width ratio grooves in the surface of monocrystalline germanium-comprising semiconductor material by orienting the material so that the surface to be etched is parallel to a (110) plane of the crystal structure; orienting an etching mask on that surface such that the length of the groove to be etched is parallel to a (111) plane of the crystal which is normal to said surface; and subjecting the semiconductor material to a preferential etchant which attacks fastest in a [110] direction of a germanium crystal and slowest in a [111] direction.

18 Claims, 18 Drawing Figures

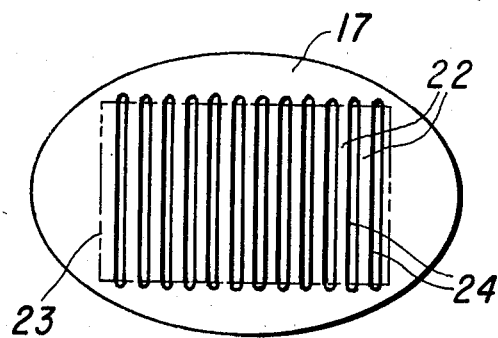
Fig.15
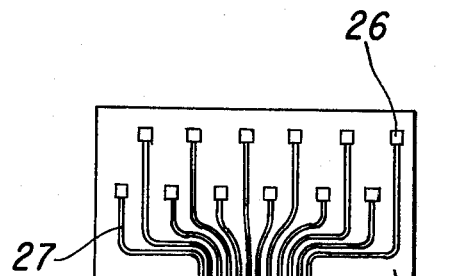
Fig.16
Fig.17
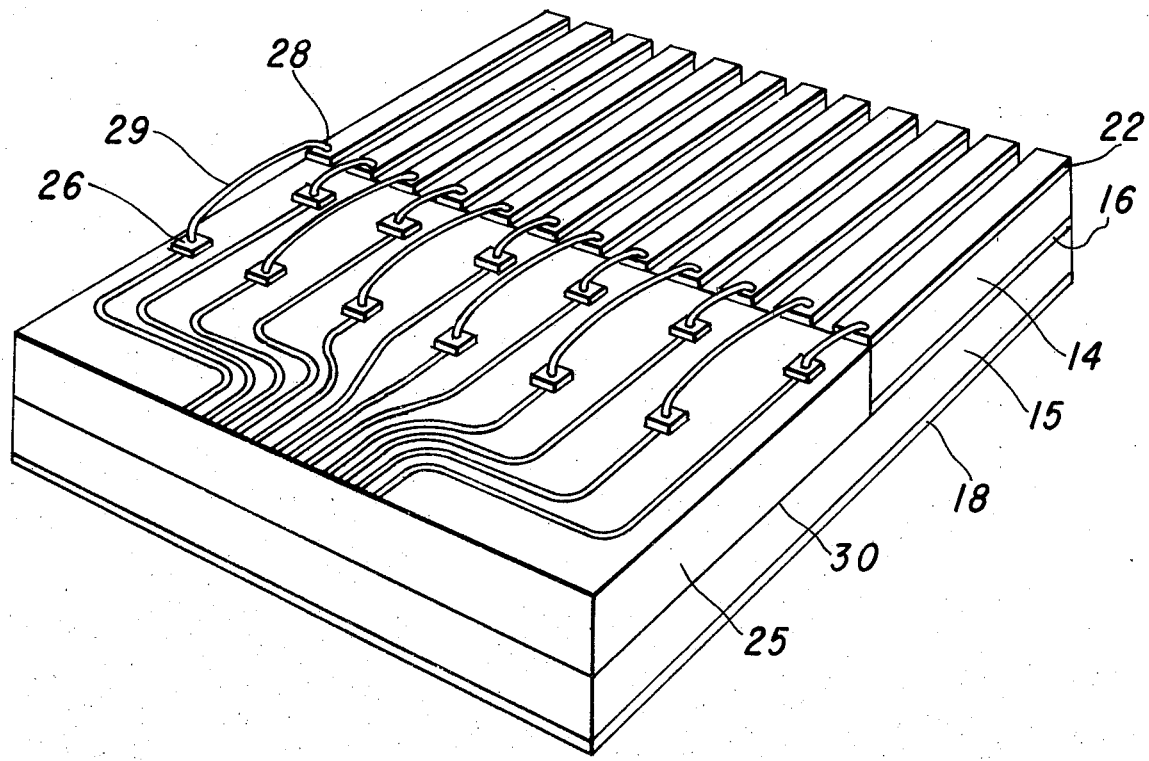

HIGH DEPTH-TO-WIDTH RATIO ETCHING PROCESS FOR MONOCRYSTALLINE GERMANIUM SEMICONDUCTOR MATERIALS

This invention relates generally to the chemical etching of germanium and, more particularly, to an etching process especially useful in the fabrication of germanium-comprising semiconductor devices.

There are many instances in the semiconductor industry where it is desirable to perform a deep etch in a monocrystalline germanium-comprising semiconductor material such as pure, impure, doped or compensated germanium while keeping the etched groove as narrow as possible. For example, in the formation of an infrared detector array having a large number of detector elements with very small, rectangular cross-sections arranged in a row, with minimum spacing between the elements, such an etching process is essential. One possiblility for separating a thin slice of germanium detector material into such individual detector bars or elements is to etch through a slice of such material which has been mounted on a conductive substrate. This is not possible using conventional etching techniques, however, because such techniques result in grooves having much greater width than depth, and consequently the elements are too far apart. Further, such grooves are usually much wider at the top than at the bottom, resulting in an undesirable cross-sectional configuration for the detector bars.

Substantial progress has been made in this art by the invention of a process which employs a malleable etching mask, and, concurrently with the formation of the etched cavity, involves vending the mask along the undercut sides of the cavity to partially protect the walls from further etching. This process is the subject matter of pending U.S. application Ser. No. 638.914 assigned to the assignee of the present invention. Further progress is made in the art by the present invention.

According to the present invention, nearly perfect, uniform cavities each having perfectly rectangular walls may be obtained. In addition, the high depth-to-width ratio of the grooves formed are perfectly uniform from one slice of germanium to another, making the process of the present invention particularly applicable to mass production of detector devices.

There are many other instances where it is desirable to etch completely through a relatively thin germanium-comprising semiconductor layer, or slice, in order to divide the slice into separate parts without sacrificing more than a minimum of surface area. For example, it is often desirable to completely separate independent, electrically operational semiconductor devices, formed on a single slice of germanium-comprising semiconductor material. It is also desirable to divide one or more semiconductor layers of germanium-comprising material, epitaxially grown on high or low resistivity substrates, or semiconductor slices alloyed to high or low resistivity substrates, into individual mesas for electrical isolation or for etching deep, narrow moats in the surface of a slice of germanium-comprising semiconductor material pursuant to the reverse lapping process as is well known in the art.

This invention relates to a process for etching a relatively narrow, relatively deep cavity in a body of monocrystalline germanium-comprising semiconductor material, whereby thin slices or layers of such material may be separated while sacrificing a minimum of surface area and also achieving sides of the etched cavity that are substantially straight and normal to the surface of the body. In accordance with one embodiment of the invention, this is achieved by so orienting the monocrystalline germanium-comprising material that the surface to be etched is parallel to a 110 plane of the crystal, and so orienting an etching mask on that surface that the length of the groove to be etched is parallel to a 111 plane of the crystal and the width of the groove is parallel to a 211 plane. That portion of the semiconductor surface which is exposed by openings in the etching mask is then subjected to an etching fluid selected for its property to etch fastest in a [110] direction of a germanium crystal and slowest in a [111] direction. For the purpose of this invention, the various planes and directions that pass through the crystal are described in terms of Miller indices which are defined as the reciprocals of the intercepts of the plane in question with the three crystallographic axes. (See W. R. Runyan, Silicon Semiconductor Technology, Chapter 5, McGraw-Hill Book Company).

For a more complete understanding of the present invention and its novel features, as well as other objects and advantages thereof, reference may now be had to the following detailed description and illustrative embodiments when read in conjunction with the appended claims and the attached drawings, in which:

FIGS. 9–17 illustrate the progressive steps in the fabrication of an infrared detector array, utilizing the high depth-to-width ratio etching process of the present invention.

The process, and its use in the fabrication of a mercury-doped germanium infrared detector array, selected as illustrative embodiments, will now be described in detail.

Figure 1A:
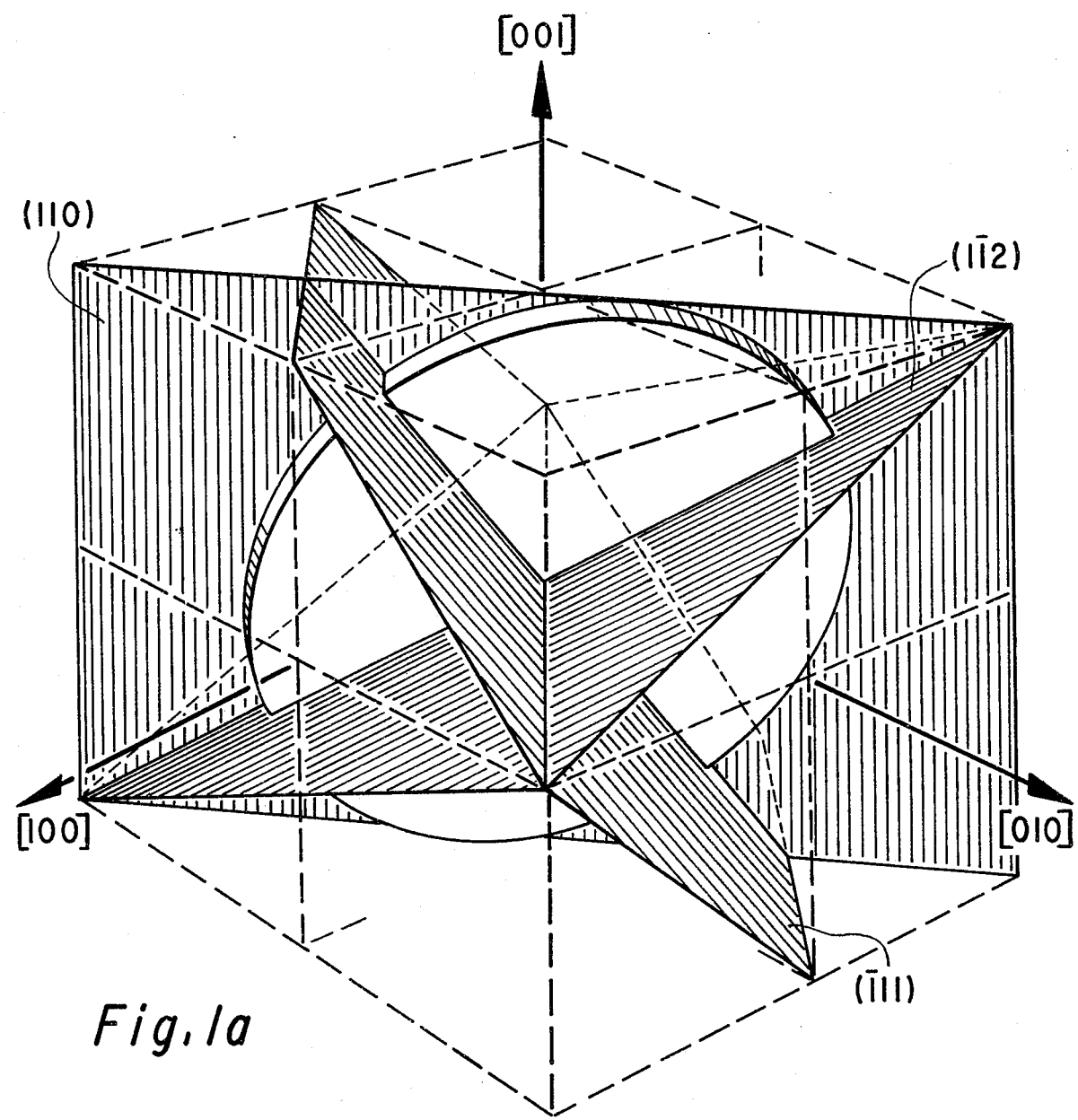
FIGS. 1a, 1b and 2 illustrate the orientation of a slice of monocrystalline germanium-comprising semiconductor material, such that the surface to be etched is a 110 face, that is, parallel to a 110 plane.
Figure 1B:
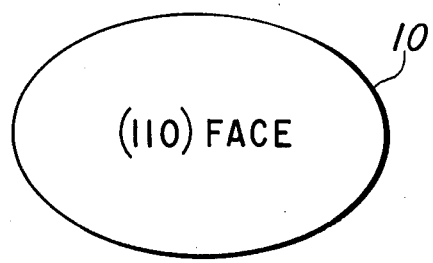
Figure 2:
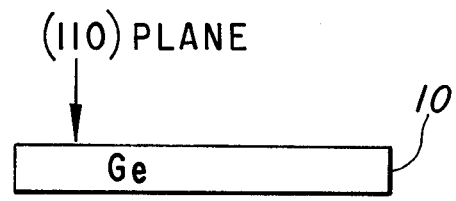

Referring to the drawings, the structure illustrated in FIGS. 1b and 2 is a slice of monocrystalline germanium-comprising semiconductor material 10 which has been fabricated such that the surface to be etched lies parallel to a 110 plane of the crystal from which the slice was fabricated, and a 111 crystal plane is both normal to the surface and parallel to its minor axis.

One known method of fabricating such a slice is to grow an ingot of monocrystalline germanium by seeding it with a 111 oriented seed, x-raying the ingot to ascertain the directions of its various planes, and aligning the ingot so that it may be sawed in a proper attitude to obtain the desired orientation of crystal planes.

Another method of fabricating a slice with proper planar orientation is to seed the ingot with a 110 faced seed aligned so that a 111 crystal plane is normal to the ingot's major axis and a 211 plane is normal to its minor axis.

In order to make the process more feasible for mass production, by preventing the necessity of sawing in unusual attitudes and preventing the possibility of the monocrystal from becoming twin, however, a preferred method of fabricating the slice is to grow an ingot by positioning a seed with a 111 plane in the growth direction and a 211 plane in the direction of the major axis of the ingot's cross-section; aligning the ingot for sawing elliptically-shaped slices parallel to a 110 plane, which have their major axes parallel to a [111] direction and minor axes parallel to a [211] direction, by rotating the ingot 35° about either of the [110] directions nearest the major axis of its cross-section; and slicing the ingot along that particular (110) plane. Thus, if the selected member of the family of {110} planes is the (110) plane, for example; that is, if the slice is cut so that the surface to be etched is parallel to the (110) plane, the member of the family of {111} planes which would be normal to the surface and parallel to its minor axis is the ($\bar{1}$11) plane, while the member of the family of{211}planes would be normal to the surface and parallel to its minor axis is the ($\bar{1}\bar{1}$2) plane, as illustrated in FIG. 1a.

Figure 3:
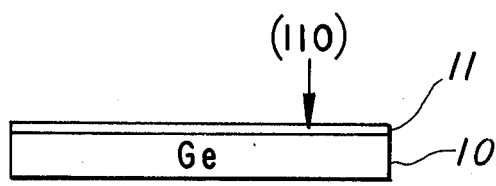
FIGS. 3–6 illustrate the orientation of an etching mask on the particular 110 face to be etched, such that the length of the grooves is parallel to a 111 plane and the widths are parallel to 211 plane.
Figure 4:
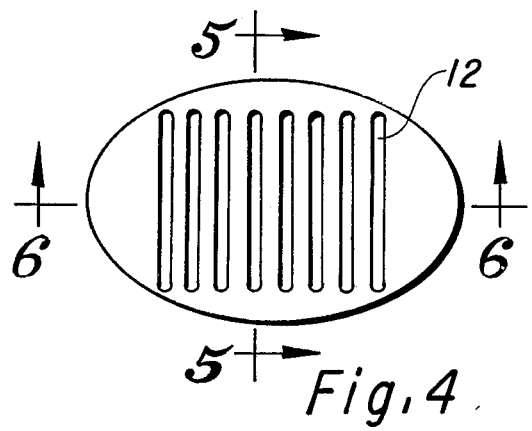
Figure 5:
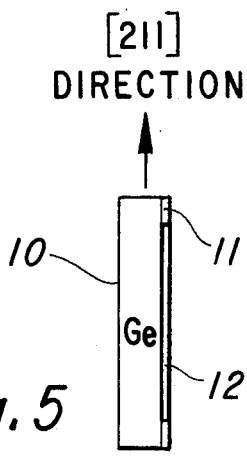
Figure 6:
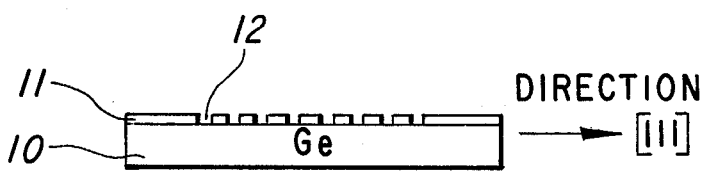

After the slice has been fabricated with the proper crystal orientation, an etching mask 11 is formed on the (110) face to be etched, as illustrated in FIG. 3. The mask is comprised of any material which is resistant to the germanium etchant such as metal or photoresist. The mask is orientated so that the length of the slots in the mask 11, corresponding to the deep, narrow grooves to be etched, lie in the direction of the minor axis of the elliptical slice and the widths of the slots lie in the direction of its major axis. This orientation is illustrated by FIGS. 4, 5 and 6, which depict the masked slice 10 in several views. FIG. 4 is a view from the (110) plane indicating in cross-section the slots 12. FIG. 5, taken along the section line 5—5 in FIG. 4, illustrates the length of the slots 12 in the mask 11 that lie in the [211] direction of the minor axis of the slice 10, while FIG. 6, taken along the section line 6—6 in FIG. 4, illustrates the width of the slots that lie in the [111] direction of the major axis of the slice 10.

Figure 7:
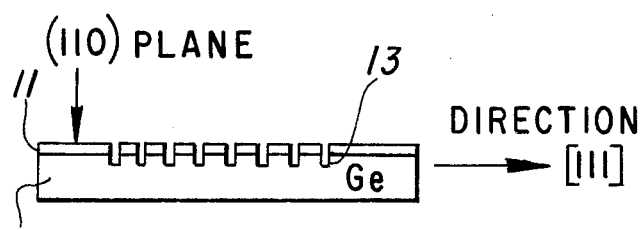
FIGS. 7 and 8 illustrate the etched grooves in the semiconductor block after exposure to a selective etching fluid.
Figure 8:
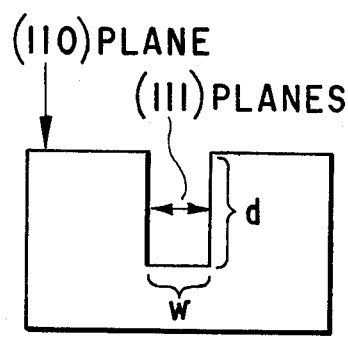

Next, as illustrated by FIG. 7, the germanium-comprising semiconductor slice is exposed, through the slots in the mask 11, to a preferential etching fluid which has the property of etching fastest in [110] direction and slowest in a [111] direction, thereby forming narrow grooves in the semiconductor material. One such etchant, by way of example, is comprised of 20% nitric acid, 40% hydrofluoric acid, 40% water and 2 grams of silver nitrate per 100 ml of solution. (See Wang, The Sylvania Technologist, Volume XI, No. 2, pages 50–58). The exposure of the slice to the etchant is continued until the desired depth is reached. The resulting etched grooves, as illustrated by FIG. 8, are relatively deep and relatively narrow such that the ratio of the depth $d$ to the width $w$ is substantially greater than unity.

Figure 9:
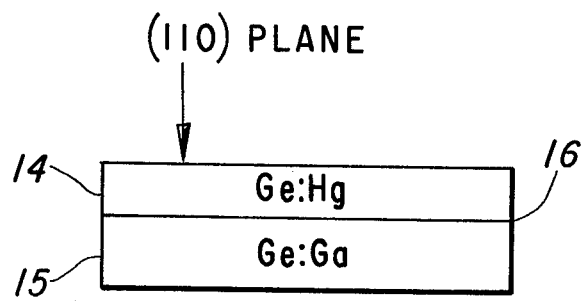

It is to be understood that the present invention is broadly applicable to the etching of high depth-to-width ratio grooves in a monocrystalline body of germanium-comprising semiconductor material, and the process, as utilized in the fabrication of a mercury-doped germanium infrared detector array, has been selected as one illustrative embodiment, which is now described in detail The structure illustrated in FIG. 9 is fabricated as follows. An elliptical slice of mercury-doped germanium indicated generally by the reference numeral 14, is fabricated with the same orientations as indicated in FIGS. 1a, 1b and 2 and described above. The slice 14, typically 0.015 inch, is machined and polished to a final thickness of 0.003 inch, and then a relatively thin layer (.0001 inch) of gold is vacuum deposited on one (110) face.

Next, a substrate of degenerate germanium, typically germanium doped with gallium having 0.0007 ohm per centimeter and indicated generally by the reference numeral 15, is also coated on one surface with a 0.0001 inch vacuum deposited layer of gold. (Not shown in FIG. 9). The slice 14 is then inverted and placed on the substrate 15 with the gold layers in contact. The stack is then placed into an alloying machine comprised of a closed space filled with dry nitrogen, a hot plate, and spring-loaded plungers. The stack is placed under a plunger and, while under pressure (about 15 psi), is heated to 370°C, which is about 15°C higher than the eutectic temperature for gold and germanium. When the alloy temperature reaches 370°C, the base of the hot plate is vibrated about 120 cps for 3 to 5 seconds. This vibration scrubs the liquid eutectic 16 into the two surfaces of the semicondutors 14 and 15 and helps to ensure a good alloyed connection between them, which connection will later serve as an electrical common conductor for the detector elements. The bonded units, as represented in FIG. 9, are then slowly cooled to room temperature.

Figure 10:
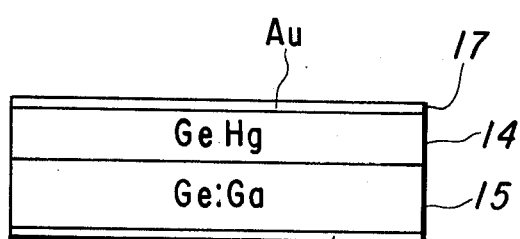

Next, the exposed (110) surface of the mercury-doped germanium slice 14 is machined and polished to a final thickness of 0.002 inch. As illustrated in FIG. 10, a gold layer 17 is the evaporated onto the (110) polished surface of the slice 14 and a gold layer 18 is also evaporated onto the back of the substrate 15. The gold layer 17 on the detector surface has a dual purpose; that of acting as an etch mask and also as the electrical contacts for individual detector elements. The gold layer 18 on the back of the substrate 15 is subsequently utilized when the detector sub-arrays are soldered to sub-mounts.

The gold is then sintered into the surfaces of the mercury-doped germanium 14 and the degenerate germanium substrate 15 by heating the entire unit to 340°C (below the eutectic temperature but high enough to form a micro-alloy between the gold and germanium). This ensures good adhesion and electrical contact between the gold and the respective germanium-comprising surfaces.

Figure 11:
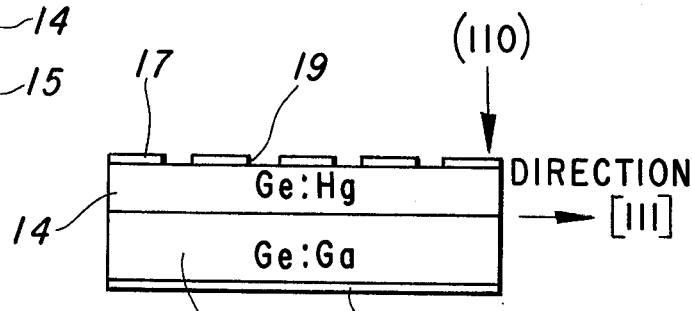

A photoresist pattern is then applied to the mercury-doped germanium gold surface 17. The pattern typically has 101 open areas for an array of one hundred elements that are 0.00025 inch wide and 0.25 inch long on 0.004 inch centers, and is oriented so that the length of the slots lies in the [211] direction of the minor axis of the mercury-doped germanium slice 14 and the width lies in the [111] direction of it major axis. Using a negative photoresist, windows 19 in the gold layer 17 are etched having the same dimensions as the photomask, as illustrated by FIG. 11.

Figure 12:
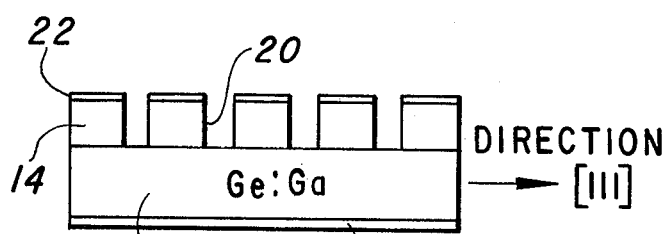

Through the slot openings in the gold, an etchant, comprised, by way of example, of 20% nitric acid, 40% hydrofluoric acid, 40% water and 2 grams of silver nitrate per 100 ml of etch solution, is applied by an etchant stream in the form of a fountain. The etching continues until deep, narrow grooves 20 are formed extending through the mercury-doped germanium slice 14, but not through the degenerate germanium substrate 15, as shown in FIG. 12.

Figure 13:
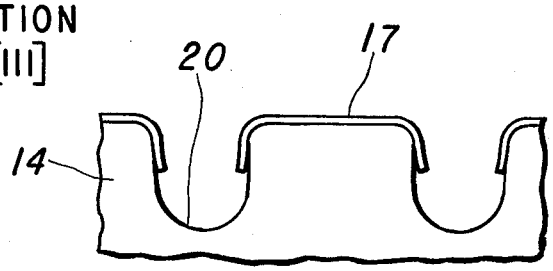
Figure 14:
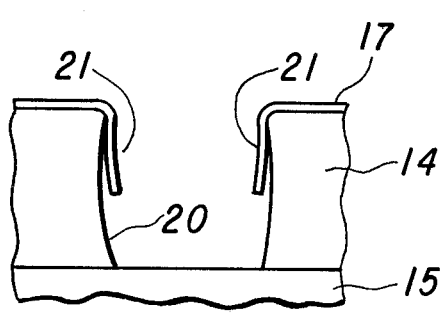

In order to prevent silver deposits from contaminating the detector elements, the etching of the mercury-doped germanium is performed in a yellow or red-lighted ambient. In addition, to achieve an added depth-to-width ratio etch suitable for detectors with many elements, portions 21 of the gold mask 17 overhanging each cavity 20 is concurrently and periodically bent down along the sides of the cavity 20 in order to partially protect the sides, as illustrated by FIGS. 13 and 14.

When the required depth of etch is reached, the block is then placed in an ultrasonic vibrator to remove that portion 21 of the mask 17 left overhanging the cavity 20.

As shown in FIGS. 15, the arrays are then trimmed on four sides (as represented by the dotted line 23) with a string-saw or similar appliance. The completed array typically has 60 to 100 or more detector elements 24, on which the remaining portions 22 of the gold etching mask 17 are utilized as electrical contacts for each of the elements.

Next, a lead film 25 suitable for the particular detector array fabricated, of which FIG. 16 represents a typical example, is fabricated from a polyimide film, onto which a layer of copper is thermo-compressed or bonded with a binder material. The copper-clad film is then subjected to photolithographic and etching techniques for circuit boards, as well known in the art, thereby patterning the required circuit array of copper ribbon leads 27 and contacts 26 on the polyimide film. The contacts 26 and leads 27 are then plated with gold by immersing the etched film 25 in a gold plating solution and passing a current through the leads.

Finally, as shown in FIG. 17, the lead film 25 is bonded to a shelf 30 of the substrate 15, which is formed by machining away a portion of the mercury-doped germanium layer 14. A small amount of varnish mixed with 50:50 alcohol and toluene composition may be employed for this purpose. After the varnish has set, each of the gold plated copper contacts 26 on the lead film 25 is electrically connected to a corresponding gold contact 28 on the surface of a detector element by bonding a gold wire 29 between the two contacts.

Although the latter illustrative embodiment herein described contains the additional step of bending a malleable etching mask along the undercut sides of each of the cavities as they are being formed, in order to further retard the etching of said sides and thereby achieve a maximum depth-to-width ratio etch, it should be noted that such step is not an essential feature of the present invention. In some instances, for example, the embodiment employing the step of bending a malleable etching mask in combination with the steps of orientating the germanium crystal for a preferential etch would yield clearly unwanted results. The etch resulting from such embodiment would be too deep and narrow for use in the fabrication of integrated circuits having a germanium layer, for example, and solely the steps of orientating the germanium crystal layer, which are the essential features of the present invention, would be employed in order to obtain the proper depth-to-width ratio and cross-section geometry. Addtionally, in the embodiment employing the step of bending a malleable mask, any malleable metal which adheres to germanium and is resistant to the germanium etchant may be utilized such as platinum or palladium. Gold is illustrated by way of example only.

While this invention has been illustrated with reference to specific embodiments, these descriptions are merely illustrative of the principles underlying the inventive concept. Various modifications of the disclosed embodiments, as well as other embodiments of the invention, will be apparent to persons skilled in the art.

What is claimed is:

1. The process for making a high depth-to-width ratio etched groove in the surface of a germanium-comprising semiconductor body which comprises the steps of:
    forming an etching mask on a (110) surface of a slice of monocrystalline germanium-comprising semiconductor material having an opening therein, the length of which is parallel to a (111) plane of the monocrystalline material which is normal to said surface; and
    subjecting the exposed area of the semiconductor surface to a preferential etching fluid which attacks a (110) plane of germanium crystal fastest and a (111) plane slowest.

2. The process defined in claim 1 wherein the preferential etching fluid is comprised of:
    nitric acid;
    hydrofluoric acid;
    water; and
    silver nitrate.

3. The process defined in claim 1 wherein the etching mask is formed by:
    vacuum depositing a layer of metal on the surface of the semiconductor body; and
    selectively removing portions of the metal layer to form openings which expose the surface of the semiconductor body.

4. The process defined in claim 3 wherein the metal layer is comprised of gold and portions of the mask, after the etching steps have been completed, are retained as electrical contacts on the surface of the individual elements which have been formed as a result of the etched grooves.

5. The process for making a high depth-to-width ratio etch in the surface of a germanium-comprising semiconductor body which comprises:
    forming a slice of monocrystalline germanium-comprising semiconductor material having a surface parallel to a (110) plane of the crystal from which it is formed;
    forming an etching mask on said surface having an opening therein, the length of which is parallel to a (111) plane of the crystal and the width parallel to a (211) plane; and
    subjecting the exposed area of the semiconductor surface to an etching fluid, which attacks a (110) plane of a germanium crystal fastest and a (111) plane slowest.

6. The process defined in claim 5 wherein the slice of monocrystalline germanium-comprising semiconductor material is formed by:
    growing a monocrystalline ingot of germanium by positioning a seed with a (111) plane in the growth direction and a (211) plane in the direction of the major axis of the cross-section of the ingot;
    mounting the ingot for sawing an elliptically-shaped slice cut parallel to an identified (110) plane with the minor axis of the ellipse parallel to a [211] direction and with its major axis parallel to a [111] direction by rotating the ingot 35° about either of the [110] directions nearest the major axis of its cross-section; and slicing the ingot along the identified (110) plane to form the slice.

7. The process defined in claim 5 wherein the etching fluid is comprised of:

nitric acid;
hydrofluoric acid;
water; and
silver nitrate.

8. The process for making a high depth-to-width ratio etched groove in the surface of a germanium-comprising semiconductor body which comprises the steps of:
forming a malleable metal etching mask on a (110) surface of a slice of monocrystal germanium-comprising semiconductor body, said mask having an opening therein whose length is parallel to a (111) plane and whose width is parallel to a (211) plane;
subjecting the exposed area of the surface to a preferential etching fluid which attacks a (110) plane of a germanium crystal fastest and a (111) plane slowest, thereby forming a groove in the body; and
concurrently with the formation of said groove periodically bending the edges of the mask left overhanging the groove along the sides of the undercut area partially protecting the side walls from contact by the etching fluid, producing side walls which are substantially perpendicular.

9. The process defined in claim 8 wherein the selected etching fluid is comprised of:
nitric acid;
hydrofluoric acid;
water; and
silver nitrate.

10. The process defined in claim 8 wherein the portions of the metal etching mask which are left overhanging the groove are removed by ultrasonic vibrations.

11. The process defined in claim 8 wherein the malleable metal etching mask is electrically conductive and only that portion of the mask left overhanging the groove is removed after the groove has been fully etched, the remaining portions of the mask being retained as electrical contacts on the surface of the individual elements formed as a result of the etched grooves.

12. The process defined in claim 11 wherein the electrically conductive malleable metal etching mask is comprised of gold.

13. The process of fabricating an array of very small, closely spaced germanium-comprising elements which comprises the steps of:
bonding a (110) surface of a thin slice of a monocrystalline germanium-comprising semiconductor material to a semiconductor substrate;
forming a malleable, electrically conductive metal etching mask having narrow slots therein on the opposite exposed (110) surface of the monocrystalline germanium-comprising material, such that the length of each of the slots is parallel to a (111) plane and the width of each of the slots is parallel to a (211) plane;
subjecting the exposed area of the semiconductor surface to an etching fluid which attacks a (110) plane of a germanium crystal fastest and a (111) plane slowest, thereby forming cavities in the body which separate the slice into a plurality of individual elements;
concurrently with the formation of said grooves, periodically bending the edges of the mask left overhanging the grooves along the sides of the undercut area partially protecting the side walls from contact by the etching fluid;
placing the slice and bonded substrate in an ultrasonic vibrator, thereby removing the overhanging portion of the mask; and
utilizing the remaining portion of the etching mask as an electrical contact on the surface of each element to electrically connect the individual elements, thereby forming an electrically operational array.

14. The process defined in claim 13 wherein the selected etching fluid is comprised of:
nitric acid;
hydrofluoric acid;
water; and
silver nitrate.

15. The process of fabricating an infrared detector array with many closely spaced rectangular detector elements which comprises the steps of:
alloying a (110) surface of a thin slice of monocrystalline germanium-comprising, photo-sensitive semiconductor material to a degenerate germanium-comprising semiconductor substrate;
vacuum depositing a layer comprised of gold on the opposite exposed (110) surface of the photo-sensitive slice;
sintering the gold into said surface by heating the slice and bonded substrate to 340°C;
photomasking the gold where slots are to be formed such that the length of the slots is parallel to a (111) plane of the slice and the width of the slots is parallel to a (211) plane of the slice;
exposing the gold to a selective etchant for gold, thereby forming slots in the gold which expose portions of said opposite (110) surface of the photo-sensitive semiconductor slice;
subjecting said portions of the semiconductor surface to an etching fluid, which attacks a (110) plane of a germanium crystal fastest and a (111) plane slowest, thereby forming grooves in the body which separate the slice into a plurality of individual elements;
concurrently with the formation of said grooves, periodically bending the edges of the mask left overhanging the grooves along the sides of the undercut area partially protecting the side walls from contact by the etching fluid;
placing the slice and bonded substrate in an ultrasonic vibrator, and thereby removing the overhanging portion of the gold mask; and
utilizing the remaining portion of the vacuum deposited gold as an electrical contact on the surface of each element to electrically connect the individual elements, thereby forming an electrically operational array.

16. The process defined in claim 15 wherein the selected etching fluid is comprised of:
nitric acid;
hydrofluoric acid;
water; and
silver nitrate.

17. The process defined in claim 15 wherein the germanium-comprising photosensitive semiconductor material is comprised of mercury-doped germanium and the substrate is comprised of degenerate gallium-doped germanium.

18. The process of making a high depth-to-width ratio etched groove in the surface of a semiconductor body comprised of monocrystalline germanium which comprises the steps of:

forming an etching mask on a crystallographic planar surface of a slice of said semiconductor body having an opening therein, the length of which is parallel to a plane of the monocrystalline body which is normal to said planar surface; and subjecting the exposed area of the semiconductor surface to a preferential etching fluid which attacks said surface plane of the germanium crystal faster than said normal plane.

* * * * *